(12) United States Patent
Ogashiwa et al.

(10) Patent No.: US 10,870,151 B2
(45) Date of Patent: Dec. 22, 2020

(54) STRUCTURE AND METHOD FOR SEALING THROUGH-HOLE, AND TRANSFER SUBSTRATE FOR SEALING THROUGH-HOLE

(71) Applicant: TANAKA KIKINZOKU KOGYO K.K., Tokyo (JP)

(72) Inventors: Toshinori Ogashiwa, Hiratsuka (JP); Yuya Sasaki, Hiratsuka (JP); Masayuki Miyairi, Hiratsuka (JP); Kenichi Inoue, Hiratsuka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 16/486,140

(22) PCT Filed: Apr. 4, 2018

(86) PCT No.: PCT/JP2018/014446
§ 371 (c)(1),
(2) Date: Aug. 14, 2019

(87) PCT Pub. No.: WO2018/190226
PCT Pub. Date: Oct. 18, 2018

(65) Prior Publication Data
US 2020/0230701 A1    Jul. 23, 2020

(30) Foreign Application Priority Data
Apr. 13, 2017    (JP) ................................. 2017-079647

(51) Int. Cl.
*B22F 7/04* (2006.01)
*B22F 3/24* (2006.01)
(Continued)

(52) U.S. Cl.
CPC .................. *B22F 7/04* (2013.01); *B22F 3/24* (2013.01); *B81B 7/0041* (2013.01);
(Continued)

(58) Field of Classification Search
CPC .............................................. B81C 2203/0145
See application file for complete search history.

(56) References Cited

U.S. PATENT DOCUMENTS

| | | |
|---|---|---|
| 2009/0309459 A1 | 12/2009 | Ogashiwa et al. |
| 2012/0212106 A1 | 8/2012 | Ogashiwa et al. |
| 2016/0272488 A1* | 9/2016 | Ogashiwa ......... H01L 23/49866 |

FOREIGN PATENT DOCUMENTS

| | | |
|---|---|---|
| EP | 3 447 794 A1 | 2/2019 |
| JP | 2007-165494 A | 6/2007 |

(Continued)

OTHER PUBLICATIONS

Extended European Search Report dated Mar. 17, 2020 for corresponding Application No. 18784237.2.
(Continued)

*Primary Examiner* — Charles D Garber
*Assistant Examiner* — Alia Sabur
(74) *Attorney, Agent, or Firm* — Foley & Lardner LLP (57) ABSTRACT

A sealing structure with a surface of a base material with a through-hole, an underlying metal film, and a sealing member bonded to the underlying metal film to seal the through-hole. The sealing member includes a compressed product of a metal powder including gold having a purity of 99.9% by mass or more and a lid-like metal film including a bulk-like metal including gold and having a thickness of not less than 0.01 μm and not more than 5 μm. The sealing material includes an outer periphery-side densified region in contact with an underlying metal film and a center-side porous region in contact with the through-hole. The shape of pores
(Continued)

in the densified region is specified, and the horizontal length (l) of a pore in the radial direction at any cross-section of the densified region and the width (W) of the densified region satisfy the relationship of $l \leq 0.1 W$.

12 Claims, 5 Drawing Sheets

(51) Int. Cl.
*B81B 7/00* (2006.01)
*B81C 1/00* (2006.01)
*H01L 21/50* (2006.01)
*H01L 23/10* (2006.01)

(52) U.S. Cl.
CPC .......... *B81C 1/00293* (2013.01); *H01L 21/50* (2013.01); *H01L 23/10* (2013.01); *B81C 2203/0145* (2013.01)

(56) References Cited

FOREIGN PATENT DOCUMENTS

| | | | |
|---|---|---|---|
| JP | 2008-028364 A | 2/2008 | |
| JP | 5065718 B2 | 11/2012 | |
| JP | 2013-211358 A | 10/2013 | |
| JP | 2015095572 A * | 5/2015 | ............. B81B 7/007 |
| JP | 2017-195291 A | 10/2017 | |
| WO | WO-2016/157562 A1 | 10/2016 | |

OTHER PUBLICATIONS

International Searching Authority, "International Search Report," issued in connection with International Patent Application No. PCT/JP2018/014446, dated May 29, 2018.

International Searching Athority, "Written Opinion," issued in connection with International Patent Application No. PCT/JP2018/014446, dated May 29, 2018.

* cited by examiner

STRUCTURE AND METHOD FOR SEALING THROUGH-HOLE, AND TRANSFER SUBSTRATE FOR SEALING THROUGH-HOLE

RELATED APPLICATIONS

The present application claims priority under 37 U.S.C. § 371 to International Patent Application No. PCT/JP2018/014446, filed Apr. 4, 2018, which claims priority to and the benefit of Japanese Patent Application No. 2017-079647, filed on Apr. 13, 2017. The contents of these applications are hereby incorporated by reference in their entireties.

TECHNICAL FIELD

The present invention relates to a sealing structure that is applied to a package member required to be airtightly sealed, such as a MEMS device or a semiconductor device. Specifically, the present invention relates to a structure for airtightly sealing a sealed space by closing a through-hole of a base material provided with a through-hole communicating with a sealed space in which an element is mounted.

BACKGROUND ART

MEMS (micro electro mechanical systems) devices such as pressure sensors and acceleration sensors, and various semiconductor devices are used while being encapsulated in packages for preventing oxidation and degradation of elements by moisture and oxygen in air. In a process for producing such a package, a cap as a lid is superposed on a base to which an element is fixed, and the cap and the base are bonded to perform airtight sealing. A brazing material is welded to the cap beforehand, and the brazing material is melted again, and bonded to the base to form an inside sealed space.

When a base and cap are bonded by use of a brazing material as described above, the degree of vacuum and degree of cleanness of the inside of the space may be changed by release of a gas component contained in a very small amount during melting of the brazing material. Here, the degree of vacuum and degree of cleanness in the internal space of the airtight sealing package are set at a level appropriate to an element to be applied. For some types of elements, even an extremely small amount of a gas component must not remain in a sealed space.

Thus, sealing structures for making it possible to adjust the degree of vacuum and degree of cleanness of the inside after formation of a sealed space include those in which a through-hole is set in a cap or a base beforehand. Among these sealing structures, a structure is known in which after a cap and a base are bonded, the inside of a sealed space is evacuated to vacuum, and a through-hole is filled with a brazing material to seal the through-hole (Patent Document 1).

RELATED ART DOCUMENT

Patent Documents

Patent Document 1: JP 2007-165494 A
Patent Document 2: JP 5065718 B2

SUMMARY OF THE INVENTION

Problems to be Solved by the Invention

With the above-mentioned sealing structure in which a through-hole is set, the degree of vacuum of a sealed space can be increased by performing an evacuation treatment after bonding of a base and a cap even if a gas component is released from a brazing material during the bonding. However, even in this sealing structure, there is a fear of being influenced by a brazing material used for closing a through-hole. Although the use amount of a through-hole sealing brazing material is not so large, there may arise a problem when an element requiring a high degree of vacuum and degree of cleanness is sealed. In addition, the possibility that in sealing of the through-hole by a brazing material, the molten brazing material enters the inside of the sealed space, and is deposited on the element and damages the element in the worst case also causes the fear of being influenced by a brazing material.

Further, the brazing material tends to involve a high working temperature depending on the type of the brazing material. Here, as a package sealing brazing material, a Au—Sn-based brazing material having favorable reliability and corrosion resistance is generally used. The Au—Sn-based brazing material has a melting point of about 280° C., and the sealing working temperature is often set to 300° C. or higher. From the viewpoint of protecting an element in a package, the temperature at which the package is heated is preferably low.

In recent years, various devices have been required to be downsized and thinned, and for meeting the requirement, processes for producing the devices have been changed. As a method for mounting an element in a device, wafer-level packaging has increasingly replaced an existing method in which chips are packaged in individually produced base caps. The wafer-level packaging is a process in which operations ranging from installation of a sealing material to assembly of a device are completed on a wafer without separating the wafer into chips. Therefore, in the wafer-level packaging, a plurality of sealing regions are set for one wafer. It is necessary to simultaneously seal a plurality of sealing regions set for one wafer. Currently, a sealing method flexibly applicable to such a process is required.

The present invention has been made in view of the above-mentioned situations, and an object of the present invention is to provide a sealing structure for airtightly sealing a sealed space having a through-hole. The sealing structure can suppress contamination in the sealed space, and attain sealing at a low temperature. In addition, a method capable of efficiently sealing a base material having a plurality of set sealed spaces as in a wafer-level packaging is revealed.

Means for Solving the Problems

The present invention provides a sealing structure including: a set of base materials forming a sealed space; at least one through-hole which is formed in at least one of the set of base materials, and communicates with the sealed space; and a sealing member that seals the through-hole. The sealing structure includes an underlying metal film on a surface of the base material in which the through-hole is formed, the underlying metal film including a bulk-like metal including at least one of gold, silver, palladium and platinum, the underlying metal film being formed so as to surround the peripheral part of the through-hole. The sealing member seals the through-hole while being bonded to the underlying metal film. The sealing member includes: a sealing material which is bonded to the underlying metal film, and includes a compressed product of a metal powder including gold having a purity of 99.9% by mass or more; and a lid-like metal film which is bonded to the sealing material, and includes a bulk-like metal including gold at least at a surface that is in contact with the sealing material, the bulk-like metal having a thickness of not less than 0.01 µm and not more than 5 µm. The sealing material includes: an outer periphery-side densified region that is in contact with the underlying metal film; and a center-side porous region that is in contact with the through-hole. A horizontal length (l) of a pore in a radial direction at any cross-section of the densified region and a width (W) of the densified region satisfy the relationship of K 0.1 W.

In the sealing structure according to the present invention, a compressed product of a predetermined metal powder is applied as a sealing member for sealing a through-hole. In this respect, the sealing structure according to the present invention is different from a conventional art mainly using a brazing material. Here, the applicant of the present application has already shown usefulness of the compressed product of a metal powder, which is applied in the invention of the present application, as a sealing material in Patent Document 2. According to Patent Document 2, a metal powder sintered body generated by applying and firing a metal paste including a solvent and a metal powder with a predetermined purity and particle size is used as a precursor of the metal powder compressed product. The metal powder sintered body as a precursor is pressurized to be densified, so that a metal powder compressed product is formed. As a mechanism of densification of the sintered body by pressurization, densification proceeds due to cooperation of a physical change that is plastic deformation and combination of the metal powder and a metal-structural change that is recrystallization caused by thermal energy. The metal powder compressed product thus formed can be expected to exhibit high airtightness, and is indicated to have a potential as a sealing member for a through-hole.

However, studies by the present inventors have revealed that when a metal powder sintered body is directly laid over a through-hole of a base material, and compressed, the sintered body at the peripheral part of the through-hole which is in contact with the base material is densified, but the sintered body communicating with the through-hole is not sufficiently compressed, porous structures remain, and in this state, sufficient airtightness is not secured. In addition, the compressed product on the densified peripheral part of the through-hole can be expected to be densified to a certain degree, but has pores (voids) in the compressed product. The pores are not completely eliminated even when the sintered body is sufficiently compressed to enhance the denseness (density) of the compressed product. The pores may cause the compressed product to have insufficient airtightness.

Thus, the present inventors have conducted studies on a sealing structure which can attain more reliable airtight sealing while applying the metal powder compressed product as a sealing member. As a result, it has been found that a metal powder compressed body which has a relatively small thickness but has an effective airtight sealing action is obtained by making the following three improvements: (1) the constituent metal of the metal powder sintered body is limited to gold; (2) two bulk-like metal films: an underlying metal film and a lid-like metal film are disposed on and under the metal powder sintered body, and the metal powder sintered body is pressurized between the bulk-like metal films to form a metal powder compressed product; and (3) the material of a surface of the lid-like metal film, which is in contact with the metal powder sintered body, is formed of a metal identical to the metal of the metal powder sintered body, i.e. gold, and the thickness of the metal film is set within a strict range.

Here, although the metal powder compressed product is improved in the manner described above, pores in the metal powder compressed product are not completely eliminated. The present inventors have found that attainment of the airtight sealing action of a metal powder compressed product does not depend only on the denseness thereof and whether pores exist or not, but the shape and the dimensions of pores also influence the airtight sealing action. In the metal powder compressed product improved by the present inventors, factors of the shape and the dimensions of pores are considered. In the sealing structure of the present invention, all the pores in a part contributing to sealing of the metal powder compressed product satisfy a predetermined requirement.

The present invention provides a sealing structure having as a main constitution a sealing material (metal powder compressed product) formed by disposing two bulk-like metal films (underlying metal film and lid-like metal film including gold) on and under a metal powder sintered body including gold, the sealing material including dimensionally controlled pores. In the present invention, a combination of a lid-like metal film and a sealing material (metal powder compressed product) is referred to as a sealing member. For the sealing structure according to the present invention, the configurations of the underlying metal film and the sealing member (metal powder compressed product and lid-like metal film), and the configuration of pores formed in the sealing material will be described in detail below. In the present invention, the concept of a set of base materials forming a sealed space includes not only an independent package obtained by combining a base and a cap that form an airtight sealing package, but also a combination of substrates in which a plurality of sealed spaces are set for simultaneously forming a plurality of airtight sealing packages. This is because the present invention is a technique that is also applicable to a wafer-level packaging. A set of base materials means a combination of two or more base materials.

Specifically, the present invention relates to a sealing structure for closing and sealing a through-hole communicating with a sealed space, and is premised on existence of a through-hole formed in a base material. At least one through-hole may be set in the sealed space, and the position, size and shape of the through-hole are not limited. Further, which base material, in a set of base materials forming the sealed space, involves the through-hole is not limited.

(A) Underlying Metal Film

In the sealing structure according to the present invention, the underlying metal film is installed for securing adhesion to the base material of the sealing material to improve airtightness at a bonding interface with the base material. Preferably, the underlying metal film includes at least one of gold, silver, palladium and platinum. These metals are applied for exhibiting an adhesion state by mutually thermally diffusing the metals with a metal powder that is the sealing material. The purity of the underlying metal film is preferably high, but is not required to be as high as the purity of the metal powder compressed product. The purity is preferably 99% by mass or more. The underlying metal film is preferably a metal identical in material to the metal of the metal powder that forms a through-electrode. The underlying metal film includes a bulk body metal, and is preferably one formed by plating (electroplating or electroless plating), sputtering, vapor deposition, a CVD method or the like. In the present invention, the bulk body means a state for discriminating the metal powder compressed product and the metal powder sintered body as a precursor of the metal powder compressed product in the present invention, and is a so called bulk (block)-like metal. The bulk body is a metal produced by melting and casting, a precipitation method or the like, and means a dense metal having a density that is 0.97 times the density of the above-mentioned metal.

It is suffice for the underlying metal film to be configured to surround at least the peripheral part of the through-hole, and may be in the form of a frame or ring extending along the outer edge of the through-hole. Here, the width of the underlying metal film is preferably identical to that of the sealing material to be bonded. In addition, the underlying metal film may be formed over the whole surface of the base material.

In addition, the underlying metal film may be deposited on a substrate with other metal film interposed therebetween. The material of the other metal film is preferably one including any of titanium, chromium, tungsten, a titanium-tungsten alloy, nickel, platinum and palladium. The other metal film is preferably one formed by plating, sputtering, vapor deposition, a CVD method or the like.

The thickness of the underlying metal film is preferably not less than 0.01 µm and not more than 10 µm. This range shows the minimum thickness for securing adhesion to the base material, and the upper limit taking account of downsizing of the device. When the other metal film is applied, the thickness of the underlying metal film including the thickness of the other metal film is preferably not less than 0.01 µm and not more than 10 µm.

(B) Sealing Member (B-1) Sealing Material (Metal Powder Compressed Product)

The above-described sealing member bonded to the underlying metal film includes a sealing material and a lid-like metal film.

The sealing material includes a compressed product of a metal powder including gold having a purity of 99.9% by mass or more. The metal powder compressed product is preferably one formed by compressing a sintered body obtained by sintering a metal powder having an average particle size of 0.01 µm to 1.0 µm. In the present invention, the constituent material of the sealing material is limited to gold. In the conventional art (Patent Document 2), metals other than gold (silver, platinum and palladium) can be applied, but in the present invention, only a metal powder including gold is applied.

Since the sealing material is intended for closing the through-hole to airtightly seal the sealed space, the lateral cross-sectional area is larger than the lateral cross-sectional area of the through-hole as a matter of course. The area of the lateral cross-section of the sealing material is preferably not less than 1.2 times and not more than 50 times the area of the lateral cross-section of the through-hole. The lateral cross-sectional area is an area in the radial direction of the through-hole.

The thickness of the sealing material is preferably not less than 0.1 µm and not more than 10 µm. A sealing material having a thickness of more than 10 µm may cause deficiency in pressurizing force in a sealing step and deterioration of uniformity, resulting in insufficient sealing, and increases the cost for gold.

In addition, it is preferable to make the sealing material thin for reducing the height of the substrate. The present invention can meet this requirement, and exhibit a sufficient sealing effect even when the sealing material has a thickness of not more than 5 µm. A sealing material having a thickness of less than 0.1 µm is apt to have gaps remaining at a bonding interface, and has a poor sealing action. The thickness of the sealing material is more preferably not less than 0.5 µm.

(B-2) Lid-Like Metal Film

In the sealing structure according to the present invention, a lid-like metal film including gold at least at a surface that is in contact with the sealing material is bonded. Airtightness of the sealing material on the upper side is secured by application of the lid-like metal film. Even after compression, the sealing material still has a porous structure at the central part that communicates with the through-hole. The lid-like metal film serves as a member (lid) for completing sealing of the through-hole by sealing one end of the porous part.

Gold is applied to a surface of the lid-like metal film for exhibiting a specially high adhesion state with a metal powder that is the sealing material. The material of the surface is limited to gold for forming a sealing material having a high sealing effect by performing compression with a metal film of a material identical to the material of the metal powder sintered body. The purity of the lid-like metal film is preferably high, but is not required to be as high as the purity of the metal powder compressed product. The purity is preferably 99% by mass or more. The lid-like metal film includes a bulk body metal, and is preferably one formed by plating (electroplating or electroless plating), sputtering, vapor deposition, a CVD method or the like. In addition, it is essential that the lid-like metal film includes gold at least at a surface that is in contact with the sealing material, but the lid-like metal film may have a multi-layered film structure in which at least some of silver, palladium and platinum are combined as long as the surface is composed of gold.

In the present invention, the sealing material (metal powder compressed product) is formed while the dimensions and the shape of pores are controlled in corporation of the underlying metal film and the thin lid-like metal film including gold at a surface that is in contact with the sealing material. The thickness of the lid-like metal film is not less than 0.01 µm and not more than 5 µm, preferably not less than 0.1 µm and not more than 3 µm. When the lid-like metal film has a multi-layered structure, the total thickness is within the above-mentioned range.

(C) Structure of Sealing Material and Dimension Condition of Pores

In the sealing structure according to the present invention, the outer periphery-side region that is in contact with the underlying metal film and the center-side region that is in contact with the through-hole in the sealing material including a metal powder compressed product are different in denseness. That is, the sealing material has a double structure including a barrel having a cross-sectional shape substantially identical to that of the through-hole, and a barrel covering an outer periphery-side surface of the foregoing barrel. In the present invention, the former is referred to as a porous region, and the latter is referred to as a densified region. In the porous region, a relatively large number of pores contained in the metal powder sintered body as a precursor of the compressed product remain. On the other hand, the densified region, in which a half or more of the pores are eliminated by compression, has a denser structure as compared to the porous region. The reason why there is a difference in denseness as described above is that in the process of forming the sealing material, the outer periphery-side densified region is pressurized while being sandwiched between both the underlying metal film and the lid-like metal film. The metal powder at a part that is in contact with the bulk-like metal film on the upper side and the lower side is pressurized from the upper side and the lower side, and thus plastically deformed and recrystallized uniformly, leading to an increase in denseness. On the other hand, a part situated on the upper side of the through-hole is only bonded to the lid-like metal film on the upper side by thermal diffusion, and is not pressurized, and therefore at this part, many voids of the sintered body remain.

In a sealing material having two regions different in denseness as described above, the state of the densified region characterizes the present invention. In the densified region, pores are eliminated while being bonded together when the metal powder sintered body is compressed. All the pores are not eliminated, and a certain amount of pores remain. The remaining pores have a indefinite shape in which a plurality of pores is bonded. In the metal powder compressed product, it is generally considered that airtightness is improved when the number of pores decreases, and thus the void content (porosity) is reduced. Of course, it is not denied that the void content is preferably low, but it may be impossible to improve airtightness simply by reducing the void content. Studies by the present inventors have shown that even when a certain amount of pores remain, airtightness can be secured as long as these pores are in a state of closed pores without continuity as their shape, and the size of pores meets a certain requirement. The present inventors have found that when a thin sintered body of gold powder is compressed with a thin gold film (lid-like metal film) in formation of a sealing material (metal powder compressed product), pores having a suitable shape are obtained.

Figure 1:
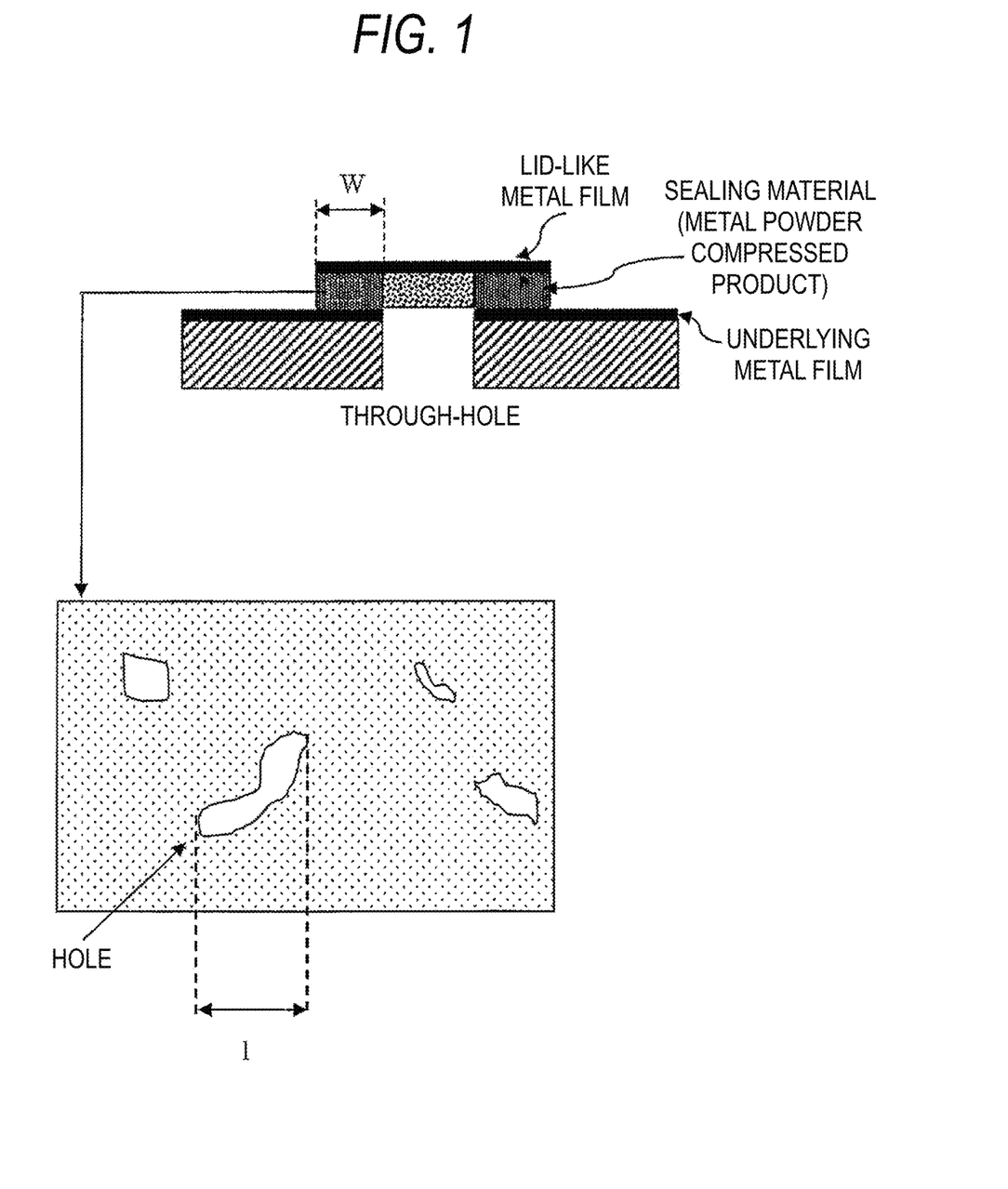
FIG. 1 illustrates a configuration of a sealing material in a sealing structure according to the present invention, and dimension conditions for pores in the sealing material.

As the pore requirement, specifically, it is required that a horizontal length (l) of a pore in a radial direction at any cross-section of the densified region and a width (W) of the densified region satisfy the relationship of $l \leq 0.1\ W$. The requirement for pores will be described with reference to FIG. 1. First, a cross-section of the densified region is observed in a visual field range enabling the whole of at least one pore to be observed. As indicated by "any cross-section", the cut section or the cutting direction during observation is not specified. The horizontal length of a pore is a projected length of a pore in a horizontal direction (lateral direction) at a cross-section observed. On the other hand, the width (W) of the densified region is a width in a horizontal direction (lateral direction), which is a width of a region where the densified region continues. The densified region is supposed to form a frame or ring shape in relation to a through-hole of a substrate, and the width of the densified region is the width of the frame or ring (see FIG. 1). It is preferable that the width of the densified region is measured at a plurality of points, and an average value of the measurements is applied.

In the present invention, the requirement of $l \leq 0.1\ W$ is applied as a relationship between the horizontal length (l) of a pore in the radial direction at any cross-section of the densified region and the width (W) of the densified region. This requirement is imposed on all the pores within a cross-section observed. When there exist pores having a horizontal length (l) greater than 0.1 W, the possibility of occurrence of leakage even in the densified region of the sealing material increases. The length of the pore has an effect rather than the area of the pore. The lower limit of the length l of the pore is not particularly limited, and the length l is preferably small, but there is limitation on the length l, and the possibility of formation of a pore having a length smaller than 0.001 times the width W is low. Thus, the length l is preferably equal to or less than 0.001 W.

In the present invention, it is necessary to meet the requirement for the shape of a pore in the densified region ($l \leq 0.1\ W$), and the amount of pores (void content) is not limited. When the void content is excessively high, a sealing effect associated with formation of pores having a suitable shape is eliminated. Therefore, in the present invention, the void content at any cross-section of the densified region is preferably 20% or less in terms of an area ratio. The void content is more preferably 15% or less. In addition, the void content is preferably low, but it is assumed that a certain amount of pores exist in the present invention. Airtightness can be secured even when there exist pores in an amount of 15% to 20% in terms of a void content.

For measurement of the shape of pores (diameter of circumscribed circle) and the void content, a cross-section is observed with a microscope such as a SEM, and by use of a photograph of the cross-sectional structures, a horizontal length is measured on the basis of the outer shape of the pores. At this time, an observation visual field is not selected in such a manner as to intentionally exclude pores. The size of the observation visual field is preferably in a range of 10 to 30 $\mu m^2$. The observation magnification is preferably 20000 to 30000 times.

The void content can be calculated from the total area of pores and the area of the observation visual field on the basis of the photograph of the cross-sectional structures. Observation of the cross-section may be performed at any portion and in any direction. For the measurement, calculator software such as image analysis software may be used.

It is not necessary to specify the above-described pore shape requirement in the densified region ($l \leq 0.1\ W$) and suitable range of void contents for pores of the porous region at the central part of the sealing material. This is because the porous region is not expected to exhibit sealing property. However, when a densified region as described above is formed in the present invention, the void content of the porous region is often 20 to 30%.

(D) Sealing Method Using Sealing Structure of the Present Invention, and Transfer Substrate A method for airtightly sealing a sealed space by use of the sealing structure according to the present invention will now be described. In the present invention, an underlying metal film is deposited on a base material provided with a through-hole, a sealing member of two-layer structure (sealing material/lid-like metal film) is bonded to the sealing material, and the through-hole is closed to airtightly a sealed space. The sealing material as a principal element of the sealing member is formed by compressing a metal powder sintered body. The metal powder sintered body as a precursor of the sealing material can be formed by sintering a metal paste in which a metal powder having a predetermined particle size is dispersed in a solvent. Thus, the underlying metal film is deposited in the through-hole of the base material, the metal paste is applied and sintered, the lid-like metal film is deposited, and pressurization is then performed to form the sealing structure according to the present invention.

In the airtight sealing method according to the present invention, an underlying metal film is deposited, a metal powder sintered body and a lid-like metal film are laminated and compressed to form a sealing member for each sealed space. This method is a base of the sealing method of the present invention, but when a plurality of sealed spaces are formed on one base material as in a wafer-level packaging, sequential formation of sealing structures in individual through-holes is not efficient. Thus, the present inventors have found a method capable of simultaneously sealing a plurality of through-holes taking advantage of the properties of the metal powder sintered body as a precursor of the sealing material.

That is, the sealing method according to the present invention includes the steps of: providing a transfer substrate at a position corresponding to a position of a through-hole of a base material that forms a sealing region, the transfer substrate including a lid-like metal film including a bulk-like metal including gold at least at a surface that is in contact with a sealing material, the bulk-like metal having a thickness of not less than 0.01 µm and not more than 5 µm, and a metal powder sintered body obtained by sintering a metal powder including gold having a purity of 99.9% by mass or more, the metal powder having an average particle size of not less than 0.01 µm and not more than 1.0 µm; forming an underlying metal film on a surface of the base material provided with the through-hole, in such a manner that the underlying metal film surrounds at least the peripheral part of the through-hole; superposing the transfer substrate and the base material one on the other so as to be opposed to each other so that the through-hole is sealed with the metal powder sintered body being in contact with the underlying metal film; and pressing the transfer substrate to form a sealing material from the metal powder sintered body, and bond the sealing material to the underlying metal film.

In the sealing method, a substrate (transfer substrate) that is a member different from a base material to be airtightly sealed is provided, and here a metal powder sintered body as a precursor of the sealing material is formed beforehand. In the sealing work, the transfer substrate is abutted against the base material, and pressurized in which a sealed space is formed, so that the formed sealing material is transferred to the base material while the metal powder sintered body is compressed. The sealing method using a transfer substrate is a process utilizing a phenomenon in which compression of a metal powder sintered body generates a strong bonding force to an underlying metal film formed on a base material to be sealed. The sealing method using a transfer substrate has such an advantage that by forming a plurality of lid-like metal films and metal powder sintered bodies on the transfer substrate beforehand, a base material provided with a plurality of through-holes can be sealed in one-time transfer operation. Hereinafter, the sealing method using a transfer substrate according to the present invention will be described.

The transfer substrate to be provided in the sealing method includes: a substrate; a projection portion formed at a position corresponding to a position of a through-hole of a base material that forms a sealing region; a lid-like metal film which is formed on at least the projection portion, and includes a bulk-like metal having a thickness of not less than 0.01 µm and not more than 5 µm; and a metal powder sintered body which is formed on the lid-like metal film, and obtained by sintering a metal powder including gold, the metal powder having a purity of 99.9% by mass or more and an average particle size of 0.01 µm to 1.0 µm.

The transfer substrate according to the present invention can be produced by forming a projection portion at any position on a substrate, and sequentially stacking a lid-like metal film and a metal powder sintered body on the projection portion.

The substrate of the transfer substrate is a plate material formed of silicon, glass, ceramic or the like as described above. This substrate has a projection portion at a position corresponding to a position of a through-hole of a base material to be sealed. The projection portion is formed, and the sealing material etc. is formed on the projection portion, so that in a subsequent transfer process, such a portion is preferentially pressurized to effectively transfer the sealing material etc. In addition, it is easy to perform positioning of the transfer substrate.

It is acceptable if the projection portion has a cross-sectional area that is not less than 1.2 times the cross-sectional area of the corresponding through-hole. The upper limit of the cross-sectional area of the projection portion is set to 30 times because the total load during transfer and bonding increases as the cross-sectional area of the projection portion becomes larger. This is because the projection portion is a structural member for transferring the sealing material to the through-hole, and has almost the same size as that of the sealing material. The height of the projection portion is preferably 1 µm to 20 µm. For formation of the projection portion, a projection can be formed on the substrate by plating etc., or the substrate may be subjected to etching processing (dry etching or wet etching), grinding processing or the like to obtain a projection portion integral with the substrate.

After the projection portion is formed on the substrate, the lid-like metal film is formed. As described above, the surface of the lid-like metal film includes gold having a purity of 99.9% by mass or more. Preferably, the lid-like metal film is formed by plating (electroplating or electroless plating), sputtering, vapor deposition, a CVD method or the like. The thickness of the lid-like metal film is not less than 0.01 µm and not more than 5 µm, preferably not less than 0.05 µm and not more than 3 µm.

A metal powder sintered body is formed on the lid-like metal film. The metal powder sintered body is obtained by sintering a metal powder having a purity of 99.9% by mass or more and an average particle size of not less than 0.01 µm and not more than 1.0 µm, and including gold. The metal powder sintered body is formed by firing a metal paste including a metal powder having the above-described purity and particle size, and an organic solvent. The metal powder sintered body is a porous material in which the ratio of the density of the constituent metal powder to the density of the bulk metal (sintered body/bulk metal) is about 0.6 to 0.7. The reason why the purity of the metal powder is set to 99.9% or more is that consideration is given to acceleration of plastic deformation and recrystallization of metal particles in formation of a sintered body and compressed product. The reason why the average particle size of the metal powder is set to 0.01 µm to 1.0 µm is that when the particle size is less than 0.01 µm, the powder is easily aggregated in the metal paste, so that uniform coating is difficult. When the metal powder has a particle size of more than 1.0 µm, it is difficult to form a dense compressed product necessary for airtight sealing.

As the organic solvent to be used in the metal paste, ester alcohol, terpineol, pine oil, butylcarbitol acetate, butylcarbitol, carbitol, isobornyl cyclohexanol (e.g. Terusolve MTPH as a product name: manufactured by Nippon Terpene Chemicals, Inc.), 2,4-diethyl-1,5-pentanediol (e.g. NIKO MARS as a product name: manufactured by The Nippon Koryo Yakuhin Kaisha, Ltd.), and dihydro-terpineol (e.g. NIKO MHD as a product name: manufactured by The Nippon Koryo Yakuhin Kaisha, Ltd.) are preferred. The metal paste may contain additives. The additives include at least one selected from an acryl-based resin, a cellulose-based resin and an alkyd resin. Examples of the acryl-based resin may include methyl methacrylate polymers, examples of the cellulose-based resin may include ethyl cellulose, and examples of the alkyd resin may include phthalic anhydride resins. These additives serve to suppress aggregation of the metal powder in the metal paste, so that the metal paste is made homogeneous. The added amount of the additive is preferably 2% by mass or less in terms of a ratio to the metal paste. Accordingly, the metal powder content can be made to fall within a range adequate for filling a through-hole while a stable aggregation suppressing effect is maintained. Preferably, the metal powder and the organic solvent in the metal paste are blended at a blending ratio of 80% by mass to 99% by mass for the metal powder and 1% by mass to 20% by mass for the organic solvent.

The metal powder sintered body is formed by applying the metal paste to a substrate provided with a lid-like metal film, and firing the applied paste. Depending on the blending ratio of the metal powder, the coating thickness of the metal paste is preferably 1 μm to 30 μm with consideration given to densification by subsequent sintering and pressurization. The method for applying the metal paste to the substrate is not particularly limited.

The heating temperature for generating the metal powder sintered body after application of the metal paste is preferably 150° C. to 300° C. When the heating temperature is lower than 150° C., the metal powder cannot be sufficiently sintered, and when the heating temperature is higher than 300° C., sintering excessively progresses, so that the metal powder is excessively hardened due to progress of necking between metal powders. As an atmosphere during firing, air, an inert gas (nitrogen, argon or helium), an inert gas containing 1% to 5% of hydrogen, or the like is selected. The firing time is preferably 30 minutes to 8 hours. When the firing time is excessively long, there arises the problem that sintering excessively progresses, so that the metal powder is excessively hardened due to progress of necking between metal powders. Through the firing of the metal paste, the metal powder is sintered and solidified into a metal powder sintered body. The metal powder sintered body after the firing is a porous material having a density that is 0.6 times to 0.7 times the density of the bulk-like metal.

In the transfer substrate according to the present invention, the thickness of the metal powder sintered body sintered under the above-described conditions is preferably not less than 0.5 μm and not more than 20 μm. The thickness is more preferably not less than 1 μm and not more than 15 μm. Through the steps described above, a lid-like metal film, and a transfer substrate for forming and transferring the sealing material are obtained.

In the configuration of the transfer substrate, it is acceptable if the lid-like metal film and the metal powder sintered body (metal paste) are formed on at least the projection portion of the substrate. This is because the sealing material etc. to be transferred may exist on at least the projection portion. However, the metal powder sintered body etc. may be formed on a substrate surface on the periphery of the projection portion. As described later, an area where the metal powder sintered body is densified into a compressed product is limited to a projection portion tip region between the lid-like metal film and the underlying metal film, and therefore there is no problem even when the metal powder sintered body etc. exists on the substrate surface on the periphery of the projection portion.

The sealing method using a transfer substrate according to the present invention will now be described. In this sealing method, a transfer substrate produced in the manner described above is prepared or acquired and provided, and on the other hand, a sealed space is appropriately formed for a base material to be sealed. The form of the base material may be a single package including a base and a cap, or a combination of wafers having a plurality of sealed spaces as described above. In any of the forms, base materials are combined to form a sealed space, and the inside of the sealed space is evacuated. In the present invention, examples of the method for bonding base materials for forming a sealed space include, but are not limited to, brazing, anodic bonding, glass welding and metal paste bonding. In addition, when the sealed space is evacuated, the degree of vacuum and degree of cleanness are not limited at all. The degree of vacuum of the sealed space depends on performance of internal elements and required precision.

For the base material in which the sealed space is formed, an underlying metal film that surrounds at least a through-hole is formed. As described above, the underlying metal film includes a bulk-like metal including at least one of gold, silver, palladium and platinum. Preferably, the underlying metal film is formed by plating (electroplating or electroless plating), sputtering, vapor deposition, a CVD method or the like. The thickness of the underlying metal film is preferably not less than 0.01 μm and not more than 10 μm. The underlying metal film may be formed over the whole surface of the base material having the through-hole, or formed in a frame or ring shape at only the peripheral part of the through-hole with masking performed as appropriate. The underlying metal film may be formed before formation of the sealed space in the base material.

In the manner described above, the base material for which the sealed space and the underlying metal film are formed is pressurized and heated with the transfer substrate abutted against the base material, so that a sealing material including a metal powder compressed product, and a lid-like metal are bonded and transferred to the underlying metal film on the base material to form a sealing structure according to the present invention. In the process for forming the sealing material, the metal powder sintered body sandwiched between the underlying metal film and the lid-like metal film is compressed and densified while being in close contact with these two bulk-like metal films. The metal powder sintered body is densified, and also firmly bonded to the underlying metal film. In this transfer step, the transfer substrate is pressurized preferably at 80 MPa to 200 MPa.

In addition, it is preferable that pressurization for transferring the sealing material is performed while at least one of the transfer substrate and the base material is heated. This is because recrystallization of the metal powder is accelerated to quickly form a dense sealing material. The heating temperature is preferably 80° C. to 300° C. The reason why sealing is possible at a relatively low temperature of 300° C. is that the metal powder sintered body, i.e. a sealing material capable of being densified at even a low temperature, is applied, and also, bulk-like metal films: the underlying metal film and the lid-like metal film are appropriately disposed.

After the sealing material is transferred, the transfer substrate is removed to form a sealing structure according to the present invention, so that airtight sealing of the sealed space is completed. In the present invention, a gas component (organic solvent) is removed from the metal powder sintered body in the process of producing the transfer substrate, so that the sealed space is not contaminated during transfer of the sealing material, and thus the degree of vacuum just before sealing can be maintained.

The metal powder may remain on the used transfer substrate. When the used transfer substrate is appropriately cleaned, and provided with the lid-like metal film etc., the transfer substrate can be reused.

Advantageous Effects of the Invention

As described above, a sealing structure according to the present invention is capable of sealing a through-hole at a relatively low temperature without contaminating a sealed space. A transfer substrate according to the present invention is capable of efficiently forming the sealing structure, and applicable even when a plurality of sealed spaces are set for one base material as in a wafer-level packaging.

DESCRIPTION OF EMBODIMENTS

First Embodiment

Hereinafter, a preferred embodiment of the present invention will be described. In this embodiment, a transfer substrate including a sealing material obtained by using a metal powder including gold having a purity of 99.9% was produced, and a base material to be sealed was processed, followed by conducting a test in which a through-hole of the substrate was sealed.

(i) Producing of Transfer Substrate

Figure 2A:
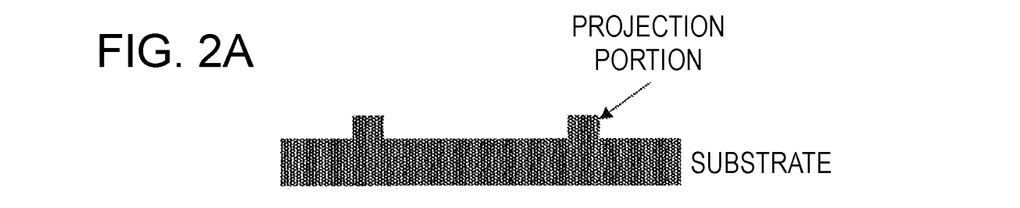
FIGS. 2A, 2B, 2C, and 2D illustrates illustrate a process for producing a transfer substrate in a first embodiment.
Figure 2B:
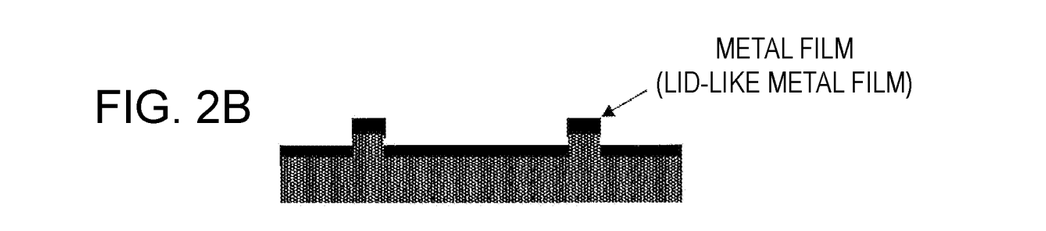

FIGS. 2A, 2B, 2C, and 2D illustrate a process for producing a transfer substrate in this embodiment. First, a silicon wafer substrate was provided, and a projection portion was formed by dry etching in conformation to the diameter and position (pitch) of the through-hole of the base material to be sealed (FIG. 2A). The projection portion is a columnar projection having a diameter of 500 μm and a height of 10 μm.

Next, as a lid-like metal film, gold (thickness: 0.5 μm, FIG. 2B) was deposited on the top surface of the projection portion of the silicon wafer substrate by sputtering. In this embodiment, the lid-like metal film was deposited over the whole surface of the substrate so as to reliably deposit each thin film on the top surface of the projection portion. As described above, a gold film (lid-like metal film) may be formed on the top of the projection portion from a practical point of view.

Figure 2C:
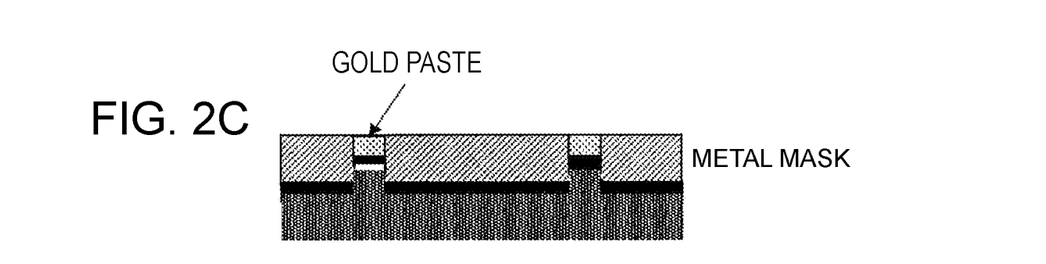
Figure 2D:
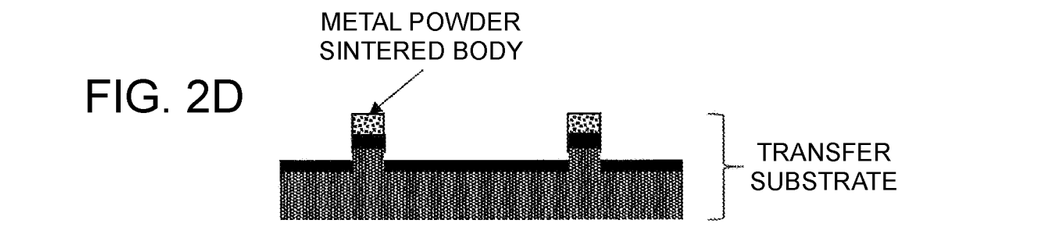

A metal paste was applied to form a metal powder sintered body on the lid-like metal film. As the metal paste, a metal paste prepared by mixing a gold powder (average particle size: 0.3 μm, purity: 99.9%) produced by a wet reduction method with isobornyl cyclohexanol (Terusolve MTPH) as an organic solvent was used (mixing ratio of gold powder: 90% by mass). The metal paste was applied by a printing method with the substrate covered with a metal mask perforated so as to surround the projection portion (FIG. 2C). After application of the metal paste, the substrate was heated at 200° C. for 2 hours to sinter the metal powder, so that a 5 μm-thick metal powder sintered body was formed on the top surface of the projection portion to complete the transfer substrate (FIG. 2D).

(ii) Pretreatment of Base Material

Figure 3A:
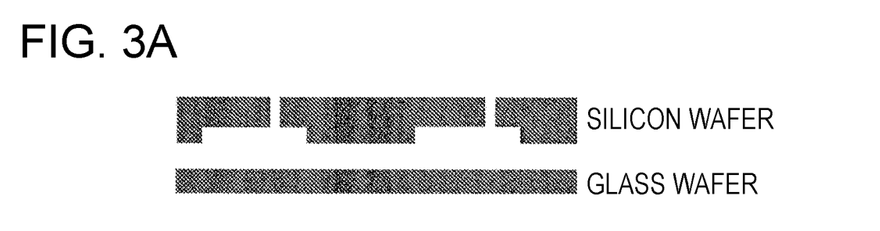
FIGS. 3A, 3B, and 3C illustrate a step of forming a base material (sealed space) in the first embodiment.

Base materials to be subjected to a sealing treatment in this embodiment include a silicon wafer (upper base material) and a glass wafer (lower base material), and a sealed space is formed by a set of two substrates (FIG. 3A). The base materials each have a thickness of 0.5 mm. A plurality of cavities (72 cavities) as sealed spaces are formed in the silicon wafer, and a through-hole communicating the cavities is formed. On the other hand, the glass wafer is a flat plate material. The cavity of the silicon wafer has a size of 2 mm square, and the through-hole is a hole having a circular cross-section with a diameter of 100 μm.

Figure 3B:
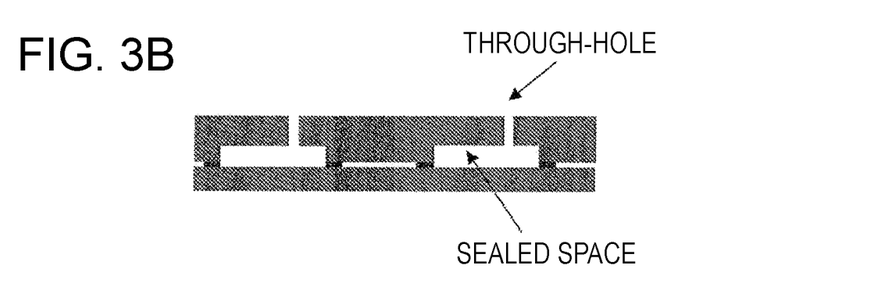

For formation off the sealed space, the silicon wafer and the glass wafer were positioned, and then bonded together by anodic bonding that is a conventional art (FIG. 3B). A bond aligner (BA 8 manufactured by SUSS MICROTEC SE.) was used for the positioning, and a wafer holder (SB 8e manufactured by SUSS MICROTEC SE.) was used for the anodic bonding. As bonding conditions, the wafers were bonded at 400° C. and −800 V for 30 minutes under a low pressing pressure in a vacuum atmosphere (10 Pa).

Figure 3C:
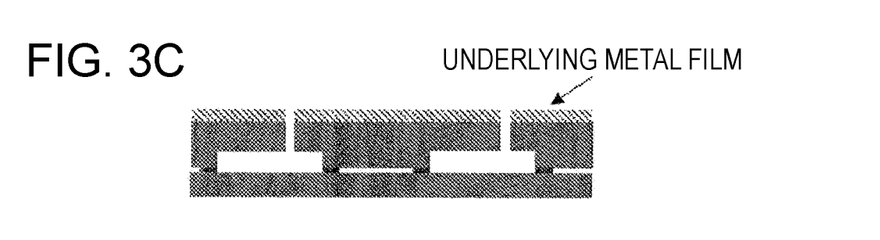

After the base materials were bonded to form a sealed space, gold was deposited as an underlying metal film on the periphery of the through-hole of the silicon wafer (FIG. 3C). In this embodiment, the underlying metal film was formed over the whole surface of the wafer, a titanium/platinum film was formed for securing adhesion, and gold was then sputtered. The gold film has a thickness of 0.5 μm.

(iii) Airtight Sealing of Sealed Space of Base Material

Figure 4A:
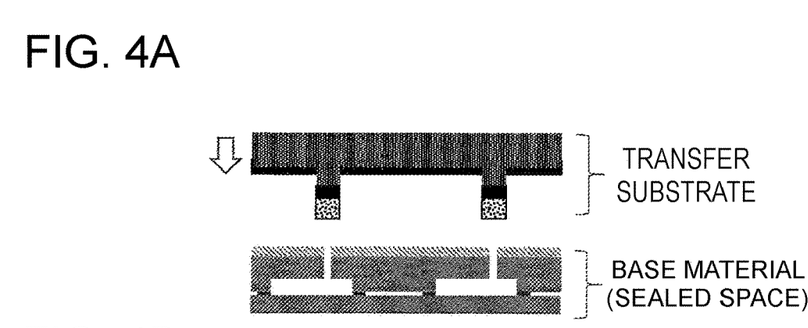
FIGS. 4A, 4B, and 4C illustrate a step of sealing the sealed space by use of the transfer substrate in the first embodiment.

The through-hole of the sealed space of the base material was sealed by use of the transfer substrate produced in (i). For matching the positions of the transfer substrate and the base material, a bond aligner (BA 8 manufactured by SUSS MICROTEC SE.) was used to perform positioning so that the projection portion of the transfer substrate corresponded to the through-hole as in FIG. 4A. Thereafter, by use of a wafer holder (SB 8e manufactured by SUSS MICROTEC SE.), the pressure was reduced to a vacuum atmosphere (10 Pa), the transfer substrate was then abutted against the base material, and pressurized, and the transfer substrate and the base material were heated by a tool with a heater. Here, as a transfer condition, the pressure of the top surface of the projection portion was 100 MPa, and as a heating condition, heating was performed to 200° C. at a temperature elevation rate of 30° C./min.

Figure 4B:
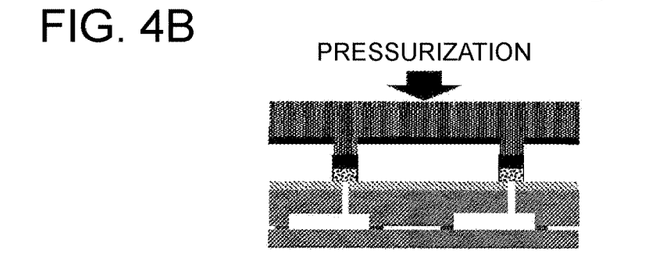
Figure 4C:
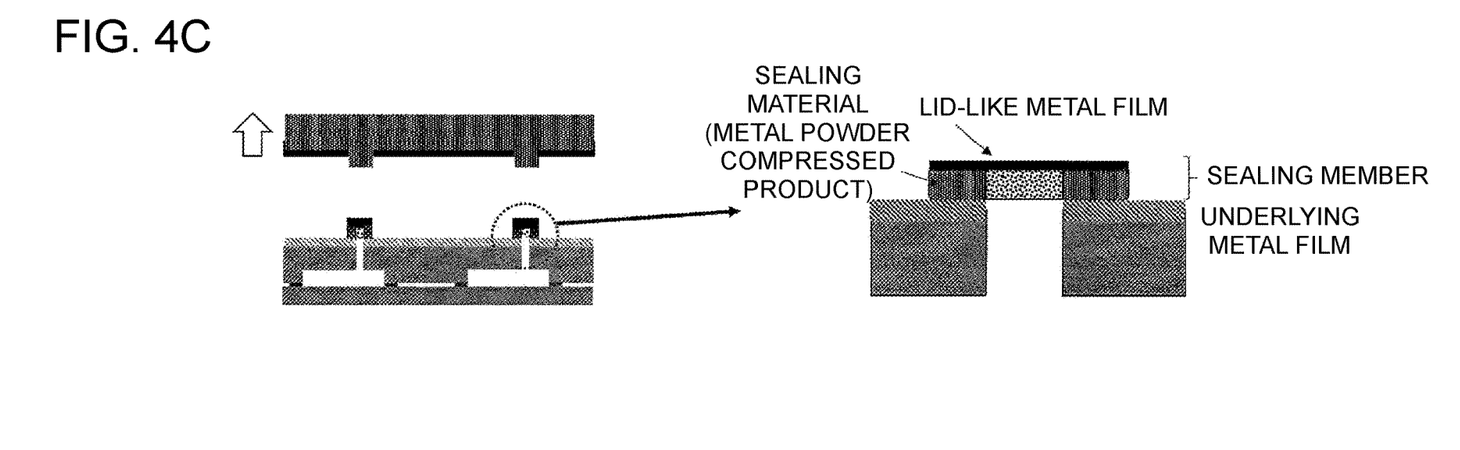

After the temperature of the transfer substrate reached 200° C., the transfer substrate was held for 10 minutes while being loaded (FIG. 4B). Thereafter, the transfer substrate was unloaded, and moved. Observation of the base material after removal of the transfer substrate revealed that the sealing member and the lid-like metal film of the transfer substrate were bonded to the through-hole (FIG. 4C). The sealing material was compressively deformed, and had a thickness of 1 μm.

Figure 5:
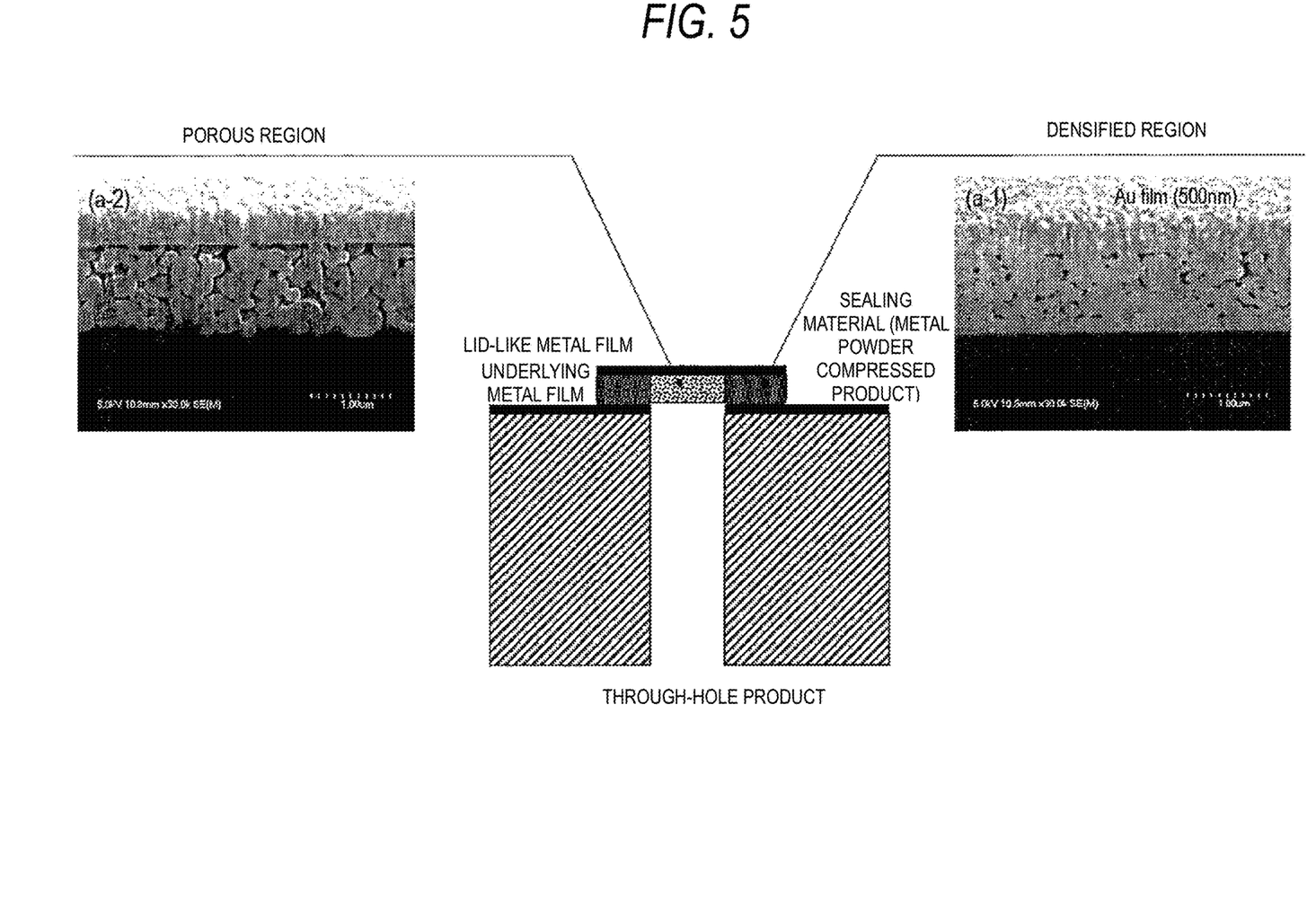
FIG. 5 is a SEM photograph showing cross-section structures of the sealing material formed in the first embodiment.

FIG. 5 shows photographs of cross-sections of a densified region at an outer peripheral part and a porous region at a central part of the metal powder compressed product as a sealing material for the sealing structure formed in this embodiment. In this embodiment, the average value of the width W of the densified region was 200 μm.

The photographs of FIG. 5 are photographs where a cross-section of the prepared sealing structure is processed and polished by a focused ion beam apparatus (FIB), and observed by SEM (30,000 fold, inclined to 45°). FIG. 5 revels a difference in densification degree between the densified region and the porous region. In the porous region, a plurality of pores (voids) are continuously connected. On the other hand, the densified region also has very small pores, but these pores are isolated from one another.

The horizontal length of a pore at any cross-section is examined with reference to FIG. 5. For all of pores visible in the image, among pores observed in the photograph of the cross-section in FIG. 5, the horizontal length (l) between both ends was measured. The results showed that the horizontal length (l) and the width (W) of an outer periphery portion as the densified region met the relationship of l≤0.1 W for each measurement. In this embodiment, the minimum value of the measured length l was about 0.005 times the width W, and the maximum value of the measured length l was about 0.01 times the width W.

In addition, from the image of a photographed cross-section, the porosity in the densified region was calculated by image analysis software (trade name "AZOKUN (ver. 2.54)" manufactured by Asahi Kasei Engineering Corporation.). In image analysis, the image was subjected to binarization processing analysis to separate pores from metal particles. As a specific procedure of the image analysis, the "number of structures" in a target image was set to 2 on the basis of the "structure analysis tool" of image analysis software, and the threshold for binarization was determined within a range of 150 to 160 while the original image was observed. The porosity was calculated by computation in the tool. The result showed that the porosity of the densified region in this embodiment was 10.4%.

Next, airtightness of the sealed space was examined for the base material, the through-hole of which was sealed. For the examination, a helium leak test (bell jar method) was conducted. In this evaluation, samples having a helium leak rate of $10^{-9}$ Pa·m$^3$/s were rated acceptable, and the helium leak rate in this embodiment was $10^{-11}$ Pa·m$^3$/s to $10^{-13}$ Pa·m$^3$/s. The result showed that in the sealing structure of this embodiment, the sealed space was airtightly sealed effectively.

Second Embodiment

Here, with a base material (sealed space) identical to that in the first embodiment, a sealing structure was formed while the constituent material and the thickness of the sealing material, and the configuration and the thickness of the lid-like metal film are adjusted. A transfer substrate was prepared while the solvent and the metal content of the metal paste were the same as in the first embodiment, and the particle size, the type and the coating thickness of the metal powder were changed. In the same manner as in the first embodiment, a silicon wafer (upper base material) and glass wafer (lower base material) were bonded to form a sealed space, so that the through-hole of the base materials was sealed. Table 1 shows the configurations of various sealing structures produced by way of trial in this embodiment, the relationship between the horizontal length of the pore and the width W, and the results of the leak test.

TABLE 1

| | Sealing material | | | Lid-like metal film | | Underling metal film | | Hole of densified region | | | Sealing test results | |
|---|---|---|---|---|---|---|---|---|---|---|---|---|
| No. | Metal powder | Particle size | Thickness (D)*1 | Metal | Thickness | Metal | Thickness | l ≤ 0.1 W | Maximum value of l/W*2 | Void content | Leak rate (Pa · m$^3$/s) | Assessment |
| 1 | Au | 0.3 μm | 1 μm | Au | 0.5 μm | Au | 0.5 μm | ○ | 0.01 | 10.4% | $10^{-11}$ to $10^{-13}$ | Passed*3 |
| 2 | | 0.01 μm | | | | | | ○ | 0.005 | 9.3% | $10^{-11}$ to $10^{-13}$ | Passed |
| 3 | | 1.0 μm | | | | | | ○ | 0.08 | 15.0% | $10^{-9}$ to $10^{-11}$ | Passed |
| 4 | | 1.2 μm | | | | | | X | 0.12 | 22.5% | $10^{-6}$ to $10^{-8}$ | Not passed |
| 5 | | 0.3 μm | 5 μm | | | | | ○ | 0.01 | 10.5% | $10^{-11}$ to $10^{-13}$ | Passed |
| 6 | | | 7 μm | | | | | ○ | 0.05 | 15.0% | $10^{-6}$ to $10^{-8}$ | Passed |
| 7 | | | 10 μm | | | | | ○ | 0.10 | 19.8% | $10^{-6}$ to $10^{-8}$ | Passed |
| 8 | | | 0.05 μm | | | | | X | 0.11 | 21.0% | $10^{-6}$ to $10^{-8}$ | Not passed |
| 9 | | | 1 μm | | 5 μm | | 0.01 μm | ○ | 0.01 | 10.6% | $10^{-11}$ to $10^{-13}$ | Passed |
| 10 | | | | | 0.01 μm | | 10 μm | ○ | 0.01 | 10.3% | $10^{-11}$ to $10^{-13}$ | Passed |
| 11 | | | | | 7 μm | | 0.5 μm | X | 0.12 | 20.5% | $10^{-6}$ to $10^{-8}$ | Not passed |
| 12 | | | | Au/Pt | 0.5 μm/ 0.05 μm | | 0.5 μm | ○ | 0.005 | 9.0% | $10^{-11}$ to $10^{-13}$ | Passed |
| 13 | | | | Au/Pd | 0.5 μm/ 0.05 μm | | | ○ | 0.005 | 8.5% | $10^{-11}$ to $10^{-13}$ | Passed |
| 14 | | | | Ag | 0.5 μm | Au | 0.5 μm | X | 0.11 | 21.0% | $10^{-6}$ to $10^{-8}$ | Not passed |
| 15 | | | | Au | 0.5 μm | None | — | — | — | — | Sealing impossible*4 | Not passed |
| 16 | | | | None | — | Au | 0.5 μm | — | — | — | Sealing impossible*4 | Not passed |
| 17 | Ag | 0.3 μm | 1 μm | Au | 0.5 μm | Ag | 0.5 μm | X | 0.13 | 25.0% | $10^{-6}$ to $10^{-8}$ | Not passed |
| 18 | Pd | | | Au | | Pd | | X | 0.12 | 24.5% | $10^{-6}$ to $10^{-8}$ | Not passed |
| 19 | Pt | | | Au | | Au | | X | 0.13 | 22.0% | $10^{-6}$ to $10^{-8}$ | Not passed |

*1 Thickness of sealing material (metal powder compressed product) after sealing
*2 Based on radial horizontal length of largest hole in observed holes
*3 No. 1 indicates first embodiment
*4 It was impossible to conduct leak test because sealed space of base material was not brought into vacuum Table 1 indicates that favorable airtight sealing properties are obtained with sealing structures having a gold powder as a sealing material. When metal powders Nos. 17 to 19, that is powders of metals other than gold, were used as sealing materials, it was possible to perform sealing to some degree, but the samples were rated "unacceptable" in the leak test. Of course, even when a gold powder is applied, airtightness is reduced when the powder has an excessively large particle size (No. 4). This is because when the metal powder is coarse, a compressed product is formed with pores having an unpreferable shape even though an underlying metal film and a lid-like metal film exist.

In the present invention, the type and the thickness of the lid-like metal influences sealing performance. When the lid-like formed film was more than 5 μm (No. 11), a sufficient sealing structure was not formed. From the results of No. 1 to No. 4, it was determined that the lid-like metal film had a sufficient thickness of 5 μm. In addition, when a metal other than gold was applied as a lid-like metal (No. 14), the sample was rated unacceptable as a sealing test result, and it was determined that application of gold was essential. However, regarding the configuration of the lid-like metal film, airtight sealing can be attained when a surface that is in contact with the sealing material is composed of Au.

Examination the thickness of the sealing material revealed that a sufficient sealing effect was exhibited even when the sealing material had a relatively large thickness of 10 μm. In addition, it was confirmed that even a sealing material having a small thickness of not more than 5 μm was effective. Therefore, it was possible to confirm that the present invention was effective even when the sealing material or the like is thinned for reducing the height of a substrate and a product. However, it was not possible to perform airtight sealing when the sealing material was excessively thin (No. 8).

The above results of examination have revealed that for exhibiting an appropriate airtight sealing property, it was important to control the maximum value of the horizontal length of the maximum pore in a radial direction as a shape of pores in the densified region of the sealing material.

INDUSTRIAL APPLICABILITY

In the present invention, a predetermined metal powder compressed product is applied as a medium for sealing a through-hole in a method for sealing a sealed space including a through-hole. In the present invention, generation of an outgas, which is a problem in conventional arts such as brazing material welding and anodic bonding, and therefore the through-hole can be sealed at a relatively low temperature without possibility of contaminating the sealed space. A sealing structure according to the present invention can be appropriately formed as a transfer substrate, and is applicable even when a plurality of sealed spaces are set for one base material as in a wafer-level packaging because the sealing structure can be efficiently formed. The present invention is effective for airtight sealing of MEMS devices such as pressure sensors and acceleration sensors, and various semiconductor devices.

The invention claimed is:

1. A sealing structure comprising: a set of base materials forming a sealed space; at least one through-hole which is formed in at least one of the set of base materials, and communicates with the sealed space; and a sealing member that seals the through-hole, wherein
   the sealing structure comprises an underlying metal film on a surface of the base material in which the through-hole is formed, the underlying metal film comprising a bulk-like metal including at least one of gold, silver, palladium and platinum, the underlying metal film being formed so as to surround the peripheral part of the through-hole,
   the sealing member seals the through-hole while being bonded to the underlying metal film,
   the sealing member comprises:
      a sealing material which is bonded to the underlying metal film, and includes a compressed product of a metal powder including gold having a purity of 99.9% by mass or more; and
      a lid-like metal film which is bonded to the sealing material, and comprises a bulk-like metal including gold at least at a surface that is in contact with the sealing material, the bulk-like metal having a thickness of not less than 0.01 μm and not more than 5 μm,
      the sealing material comprises: an outer periphery-side densified region that is in contact with the underlying metal film; and a center-side porous region that is in contact with the through-hole, and
      a horizontal length (l) of a pore in a radial direction at any cross-section of the densified region and a width (W) of the densified region satisfy the relationship of $l \leq 0.1 W$.

2. The sealing structure according to claim 1, wherein the sealing material has a thickness of not less than 0.1 μm and not more than 10 μm.

3. The sealing structure according to claim 1, wherein the underlying metal film has a thickness of not less than 0.01 μm and not more than 10 μm.

4. The sealing structure according to claim 1, wherein a void content at any cross-section of the densified region is 20% or less in terms of an area ratio.

5. The sealing structure according to claim 1, wherein an area of a lateral cross-section of the sealing material is not less than 1.2 times and not more than 50 times the area of a lateral cross-section of the through-hole.

6. The sealing structure according to claim 1, wherein the sealing material is formed by compressing a sintered body of a metal powder including gold, the metal powder having a purity of 99.9% by mass or more and an average particle size of 0.01 μm to 1.0 μm.

7. A sealing method for forming the sealing structure defined in claim 1, comprising the steps of:
   providing a transfer substrate at a position corresponding to a position of a through-hole of the base material that forms a sealing space, the transfer substrate comprising the lid-like metal film including a bulk-like metal including gold at least at a surface that is in contact with the sealing material, the bulk-like metal having a thickness of not less than 0.01 μm and not more than 5 μm, and the metal powder sintered body obtained by sintering a metal powder including gold having a purity of 99.9% by mass or more, the metal powder having an average particle size of not less than 0.01 μm and not more than 1.0 μm;
   forming an underlying metal film on a surface of the base material provided with the through-hole, in such a manner that the underlying metal film surrounds at least the peripheral part of the through-hole;
   superposing the transfer substrate and the base material one on the other so as to be opposed to each other so that the through-hole is sealed with the metal powder sintered body being in contact with the underlying metal film; and
   pressing the transfer substrate to form the sealing material from the metal powder sintered body, and bond the sealing material to the underlying metal.

8. The sealing method according to claim 7, wherein the transfer substrate is pressed while at least one of the transfer substrate and the base material is heated at 80° C. to 300° C.

9. A transfer substrate to be used in the sealing method defined in claim 7, comprising;
- a substrate;
- a projection portion formed at a position corresponding to a position of a through-hole of the base material on the substrate;
- the lid-like metal film which is formed on at least the projection portion, and includes a bulk-like metal including gold at least at a surface that is in contact with the sealing material, the bulk-like metal having a thickness of not less than 0.01 µm and not more than 5 µm; and
- the metal powder sintered body which is formed on the lid-like metal film, and obtained by sintering a metal powder including gold, the metal powder having a purity of 99.9% by mass or more and an average particle size of 0.01 µm to 1.0 µm.

10. The transfer substrate according to claim 9, wherein the metal powder sintered body has a thickness of not less than 0.5 µm and not more than 20 µm.

11. The sealing structure according to claim 2, wherein the underlying metal film has a thickness of not less than 0.01 µm and not more than 10 µm.

12. A transfer substrate to be used in the sealing method defined in claim 8, comprising;
- a substrate;
- a projection portion formed at a position corresponding to a position of a through-hole of the base material on the substrate;
- the lid-like metal film which is formed on at least the projection portion, and includes a bulk-like metal including gold at least at a surface that is in contact with the sealing material, the bulk-like metal having a thickness of not less than 0.01 µm and not more than 5 µm; and
- the metal powder sintered body which is formed on the lid-like metal film, and obtained by sintering a metal powder including gold, the metal powder having a purity of 99.9% by mass or more and an average particle size of 0.01 µm to 1.0 µm.

* * * * *